United States Patent
Tanino

[11] Patent Number: 6,153,166
[45] Date of Patent: *Nov. 28, 2000

[54] SINGLE CRYSTAL SIC AND A METHOD OF PRODUCING THE SAME

[75] Inventor: Kichiya Tanino, Sanda, Japan

[73] Assignee: Nippon Pillar Packing Co., Ltd., Osaka, Japan

[*] Notice: This patent is subject to a terminal disclaimer.

[21] Appl. No.: 09/147,621

[22] PCT Filed: Jun. 23, 1998

[86] PCT No.: PCT/JP98/02798

§ 371 Date: Feb. 3, 1999

§ 102(e) Date: Feb. 3, 1999

[87] PCT Pub. No.: WO99/00538

PCT Pub. Date: Jan. 7, 1999

[30] Foreign Application Priority Data

Jun. 27, 1997 [JP] Japan .................................. 9-172017
Jul. 4, 1997 [JP] Japan .................................. 9-215414

[51] Int. Cl.[7] .................................. C30B 1/04; C30B 29/36
[52] U.S. Cl. .................................. 423/345; 117/4; 117/7; 117/8; 117/9; 117/84; 117/88; 117/951
[58] Field of Search .................................. 117/1, 4, 3, 7, 117/8, 9, 951, 84, 87, 88, 94, 97; 428/446, 620; 423/345

[56] References Cited

U.S. PATENT DOCUMENTS

| | | | |
|---|---|---|---|
| 4,565,584 | 1/1986 | Tamura et al. | 117/9 |
| 4,578,143 | 3/1986 | Arai | 117/45 |
| 4,590,130 | 5/1986 | Cline | 428/446 |
| 4,738,935 | 4/1988 | Shimbo et al. | 117/1 |
| 5,100,839 | 3/1992 | Terao | 117/1 |
| 5,471,946 | 12/1995 | Scholz et al. | 117/84 |
| 6,053,973 | 4/2000 | Tanino et al. | 117/4 |

*Primary Examiner*—Benjamin L. Utech
*Assistant Examiner*—Donald L. Champagne
*Attorney, Agent, or Firm*—Jones, Tullar & Cooper, P.C.

[57] ABSTRACT

According to the present invention, a complex (M) which is formed by stacking a polycrystalline β-SiC plate 2 on the surface of a single crystal α-SiC base material 1 in a close contact state via a polished face or grown in a layer-like manner by the thermal CVD method is heat-treated in a temperature range of 1,850 to 2,400° C., whereby polycrystals of the polycrystalline cubic β-Sic plate are transformed into a single crystal, and the single crystal oriented in the same direction as the crystal axis of the single crystal α-SiC base material is grown. As a result, large single crystal SiC of high quality which is free from micropipe defects, lattice defects, generation of grain boundaries due to intrusion of impurities, and the like can be produced easily and efficiently.

21 Claims, 6 Drawing Sheets

SINGLE CRYSTAL SIC AND A METHOD OF PRODUCING THE SAME

CROSS REFERENCE TO RELATED APPLICATIONS

This application discloses subject matter in common with application, No. 09/147,620, filed Feb. 13, 1999.

TECHNICAL FIELD

The present invention relates to single crystal SiC and a method of producing the same, and more particularly to single crystal SiC which is used as a substrate wafer for a high temperature semiconductor electronic element such as a light-emitting diode, an X-ray optical element, a switching element, an amplifying element, and an optical sensor, and also to a method of producing the same.

BACKGROUND ART

SiC (silicon carbide) is superior in heat resistance and mechanical strength to existing semiconductor materials such as Si (silicon) and GaAs (gallium arsenide), and has good resistance to radiation. In addition, it is easy to perform valence control of electrons and holes by doping an impurity. Moreover, SiC has a wide band gap (for example, single crystal 6H-SiC has a band gap of about 3.0 eV, and single crystal 4H-SiC has a band gap of 3.26 eV). Therefore, it is possible to realize a large capacity, high-frequency property, dielectric property, and environmental resistance which cannot be realized by existing semiconductor materials. SiC is receiving attention and is expected as a semiconductor material for a next-generation power device.

As a method of producing (growing) single crystal SiC of this type, known are a method in which single crystal SiC is grown by a sublimation and recrystallization method using a seed crystal, and that in which, in the case of a high temperature, epitaxial growth is conducted on a silicon substrate by using a chemical vapor deposition method (CVD method), thereby growing single crystal cubic SiC (β-SiC).

In the above-described conventional production methods, however, the crystal growth rate is as low as 1 μm/hr. Furthermore, the sublimation and recrystallization method has a problem in that pin holes which have a diameter of several microns and which pass through the crystal in the growing direction remain at about 100 to 1,000/cm$^2$ in a growing crystal. Such pin holes are called micropipe defects and cause a leakage current when a semiconductor device is fabricated. These problems block a practical use of single crystal SiC which has superior characteristics as compared with other existing semiconductor materials such as Si and GaAs as described above.

In the case of the high-temperature CVD method, the substrate temperature is as high as 1,700 to 1,900° C., and it is required to produce a high-purity reducing atmosphere. Therefore, the method has a problem in that it is difficult to conduct the method from the view point of installation. Furthermore, the method has another problem in that, because of epitaxial growth, the growth rate is naturally limited.

SUMMARY OF THE INVENTION

It is an object of the present invention to provide large single crystal SiC of high quality which has a reduced number of micropipe defects and the like, and a method of producing single crystal SiC which can produce such large single crystal SiC of high quality easily and efficiently from the view point of installation and workability, and which can expedite the practical use of the single crystal as a semiconductor material.

The single crystal SiC of the present invention is characterized in that a complex in which a single crystal SiC base material and a polycrystalline plate consisting of Si and C atoms are stacked together via a smooth face is subjected to a heat treatment, whereby polycrystals of the polycrystalline plate are transformed into a single crystal.

According to this configuration, polycrystals of the polycrystalline plate are phase-transformed by only applying means which thermally processes a complex consisting of a single crystal SiC base material and a polycrystalline plate that are stacked together, and which is simple from the view point of installation and workability, so that a single crystal is efficiently grown. Since the single crystal SiC base material and the polycrystalline plate are heat-treated via the smooth face, moreover, no external impurity enter the interface between them during the heat treatment. Consequently, it is possible to obtain single crystal SiC of very high quality which is free from lattice defects and micropipe defects and also defects such as generation of grain boundaries due to intrusion of impurities. As a result, it is possible to attain the effect of expediting the practical use of single crystal SiC which is superior in high-temperature property, high-frequency property, dielectric property, and environmental resistance to existing semiconductor materials such as Si (silicon) and GaAs (gallium arsenide), and which is expected as a semiconductor material for a power device.

The single crystal SiC of the present invention is characterized in that a complex in which plural single crystal SiC base materials that are regularly arranged with contacting adjacent side faces to one another, and a polycrystalline plate consisting of Si and C atoms are stacked together is subjected to a heat treatment, whereby polycrystals of the polycrystalline plate are transformed into a single crystal.

According to this configuration, as a result of the heat treatment of the complex, it is possible to obtain single crystal SiC of high quality in which lattice defects, micropipe defects, generation of grain boundaries, and the like are little generated. Furthermore, the present invention attains the effects that the side faces of the plural single crystal SiC base materials are fusedly integrated with each other so that single crystal SiC which is large in terms of area can be easily obtained, and that single crystal SiC which has various performances superior to existing semiconductor materials can be applied in a variety of ways as a semiconductor material in the range from a small product to a large product.

In the method of producing single crystal SiC of the present invention, preferably, a single crystal SiC base material and a polycrystalline plate consisting of Si and C atoms are smoothed in at least one face, and the single crystal SiC base material and the polycrystalline plate are stacked together via the smooth face, and the complex is then subjected to a heat treatment to transform polycrystals of the polycrystalline plate into a single crystal and grow the single crystal.

This production method can attain the effect that single crystal SiC of high quality which has a very reduced number of lattice defects, micropipe defects, and grain boundaries are grown easily and efficiently so that single crystal SiC which is available as a semiconductor material having a very high performance can be stably produced and supplied on an industrial scale.

In the method of producing single crystal SiC of the present invention, plural single crystal SiC base materials that are regularly arranged with contacting adjacent side faces to one another, and a polycrystalline plate consisting of Si and C atoms are stacked together, and the complex is then subjected to a heat treatment, whereby polycrystals of the polycrystalline plate are transformed into a single crystal and grown.

In this production method, single crystal SiC of high quality which has a reduced number of the above-mentioned lattice defects, micropipe defects, grain boundaries, and the like, and which is large in terms of area is efficiently grown, thereby attaining an effect that single crystal SiC which is excellent in performance and which has a wide application range as a semiconductor material can be stably produced and supplied on an industrial scale.

In the production methods, when the polycrystalline plate constituting the complex is an amorphous plate or a polycrystalline β-SiC plate grown on the surfaces of plural single crystal SiC base materials by the thermochemical vapor deposition and the thermochemical vapor deposition temperature of the amorphous plate or the polycrystalline β-SiC plate is set to be in the range of 1,300 to 1,900° C., the present invention attains an effect that single crystal SiC of high purity and high quality and having lattice defects and micropipe defects which are further smaller in number than those of the single crystal SiC base materials can be obtained while supressing the entering of impurities between the plural single crystal SiC base materials and the polycrystalline plate on the surface thereof, and diffusion of the impurities.

In the production method, when single crystal SiC obtained by a heat treatment of a complex is used as the plural single crystal SiC base materials that is regularly arranged with contacting adjacent side faces to one another, single crystal SiC which is obtained as a result of one heat treatment and large in terms of area is reused and a heat treatment is repeatedly performed, whereby large single crystal SiC which is very large in area and thickness can be easily produced as a final product. Therefore, the present invention attains an effect that the application range as a semiconductor material of high quality can be further expanded.

DETAILED DESCRIPTION OF THE PREFERRED EMBODIMENTS

Figure 1:
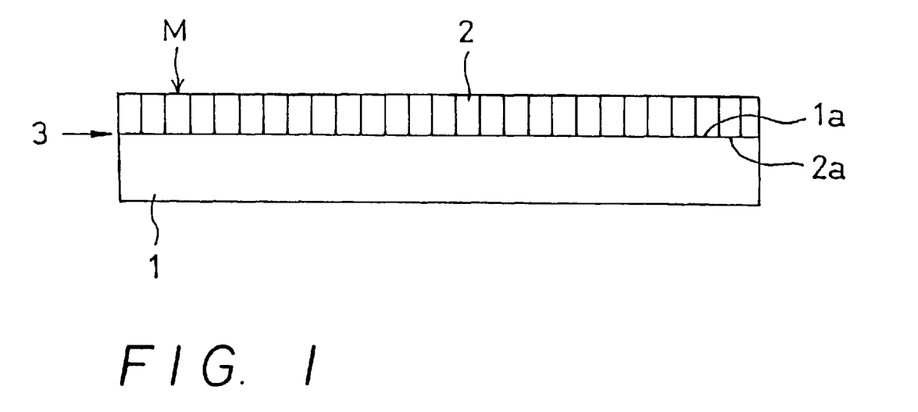
FIG. 1 is a diagram showing a state of a first embodiment of the present invention before single crystal SiC is heat-treated.

Hereinafter, a first embodiment will be described. FIG. 1 diagrammatically shows a complex M before single crystal SiC is heat-treated. In the figure, 1 denotes a single crystal hexagonal α-SiC base material (6H type or 4H type) having a plate-like shape. The single crystal α-SiC base material 1 is produced by the sublimation or the Atchison method. The surface 1a of the base material is smoothly polished. The reference numeral 2 denotes a polycrystalline cubic β-SiC plate which is separately produced by the thermochemical vapor deposition method (hereinafter, referred to as the thermal CVD method) in the range of 1,300 to 1,900° C. One face 2a of the plate is smoothly polished. The polycrystalline β-SiC plate 2 and the single crystal α-SiC base material 1 are closely stacked via the polished surfaces 2a and 1a, thereby producing the complex M in which crystal faces of different crystal forms contact each other so as to show a clear linear interface 3.

Figure 2:
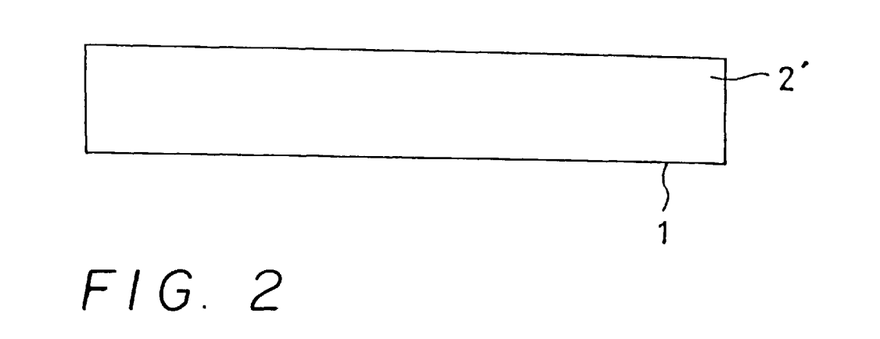
FIG. 2 is a diagram showing a state of the first embodiment of the present invention after the single crystal SiC is heat-treated.

Thereafter, the whole of the complex M is subjected to a heat treatment in which the complex is held for about 8 hours in an atmosphere of a temperature range of 1,850° C. or higher, preferably 2,200 to 2,400° C. and a saturated SiC vapor pressure. As a result, the polycrystalline β-SiC plate 2 is transformed into a single crystal, and, as shown in FIG. 2, polycrystals of the polycrystalline β-SiC plate 2 are converted into a single crystal portion 2' which is oriented in the same direction as the crystal axis of the single crystal α-SiC base material 1. The single crystal portion 2' is integrated with the single crystal of the single crystal α-SiC base material 1 to be grown as a large single crystal. After the heat treatment, the interface 3 which has clearly appeared before the heat treatment is fusedly integrated to disappear.

As described above, the complex M consisting of the single crystal α-SiC base material 1 and the polycrystalline β-SiC plate 2 which closely contacted to each other via the smoothly polished faces 1a and 2a is subjected to a heat treatment. Therefore, crystal growth mainly consisting of solid-phase growth, such as the lattice vibration which occurs in the interface 3 to change the atom arrangement, is generated. As a result, single crystal SiC of high quality which has no micropipe defects and which is substantially free from other defects such as lattice defects (10 or less per 1 $cm^2$) can be produced at high productivity. When the single crystal α-SiC base material 1 which has been used in the phase transformation to an α-single crystal in the polycrystalline β-SiC plate 2 is polished or cut away, it is possible to obtain a high quality wafer for an electronic device.

Figure 3:
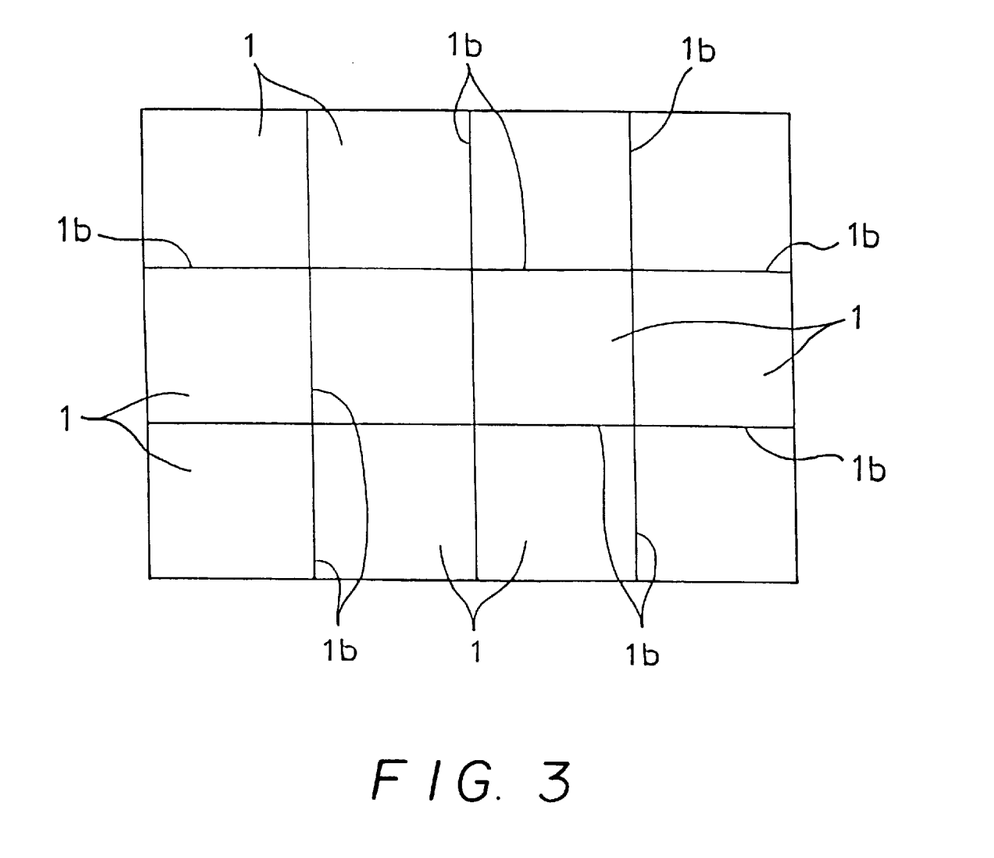
FIG. 3 is a plan view showing a state before single crystal SiC of a second embodiment of the present invention is heat-treated.

Next, a second embodiment will be described. As shown in FIG. 3, plural single crystal α-SiC base materials 1 . . . the surface of each of which is smoothly polished are regularly arranged so that the side faces 1b, 1b . . . of adjacent single crystal α-SiC base materials 1 . . . closely contact each other. The polycrystalline β-SiC plate 2 is stacked on the polished faces of the plural single crystal α-SiC base materials 1 . . . which are regularly arranged, in such a manner that the polished face of the plate is closely contact polished faces. In the same manner as described above, the complex is then subjected to a heat treatment in which the complex is held for about 8 hours in an atmosphere of a temperature range of 1,850° C. or higher, preferably 2,200 to 2,400° C. and in a saturated SiC vapor pressure. As a result, the polycrystalline β-SiC plate 2 is transformed into a single crystal, and a single crystal which is oriented in the same direction as the crystal axes of the plural single crystal α-SiC base materials 1 ... is integrally grown, and the closely contacted side faces 1*b* of the adjacent single crystal α-SiC base materials 1, 1 ... are fusedly integrated with each other. By repeating this process, single crystal SiC of a large area is obtained.

Figure 4:
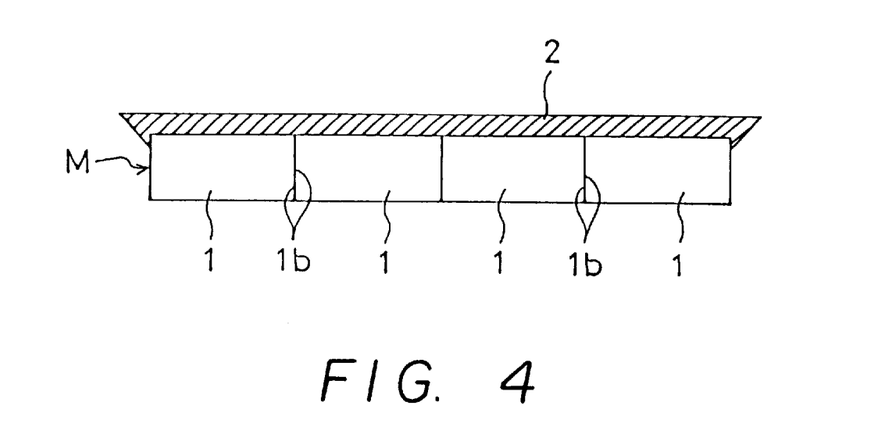
FIG. 4 is a diagram showing a state of a third embodiment of the present invention before single crystal SiC is heat-treated.
Figure 5:
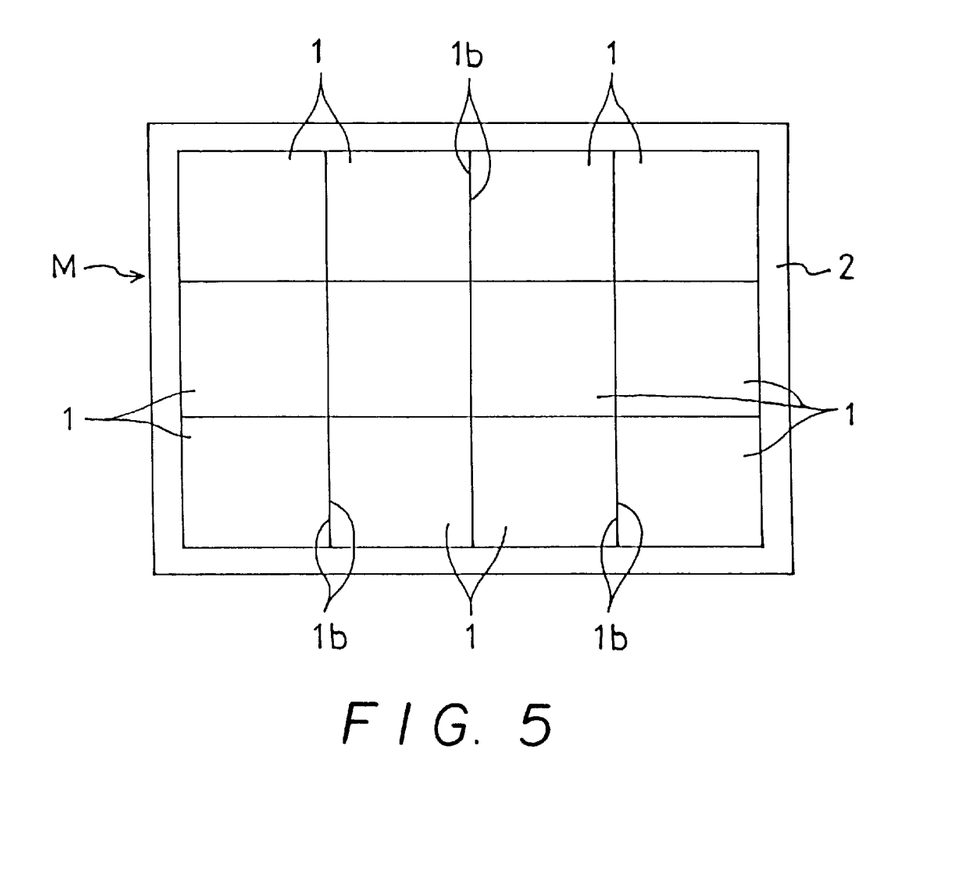
FIG. 5 is a schematic bottom view of FIG. 4.
Figure 6:
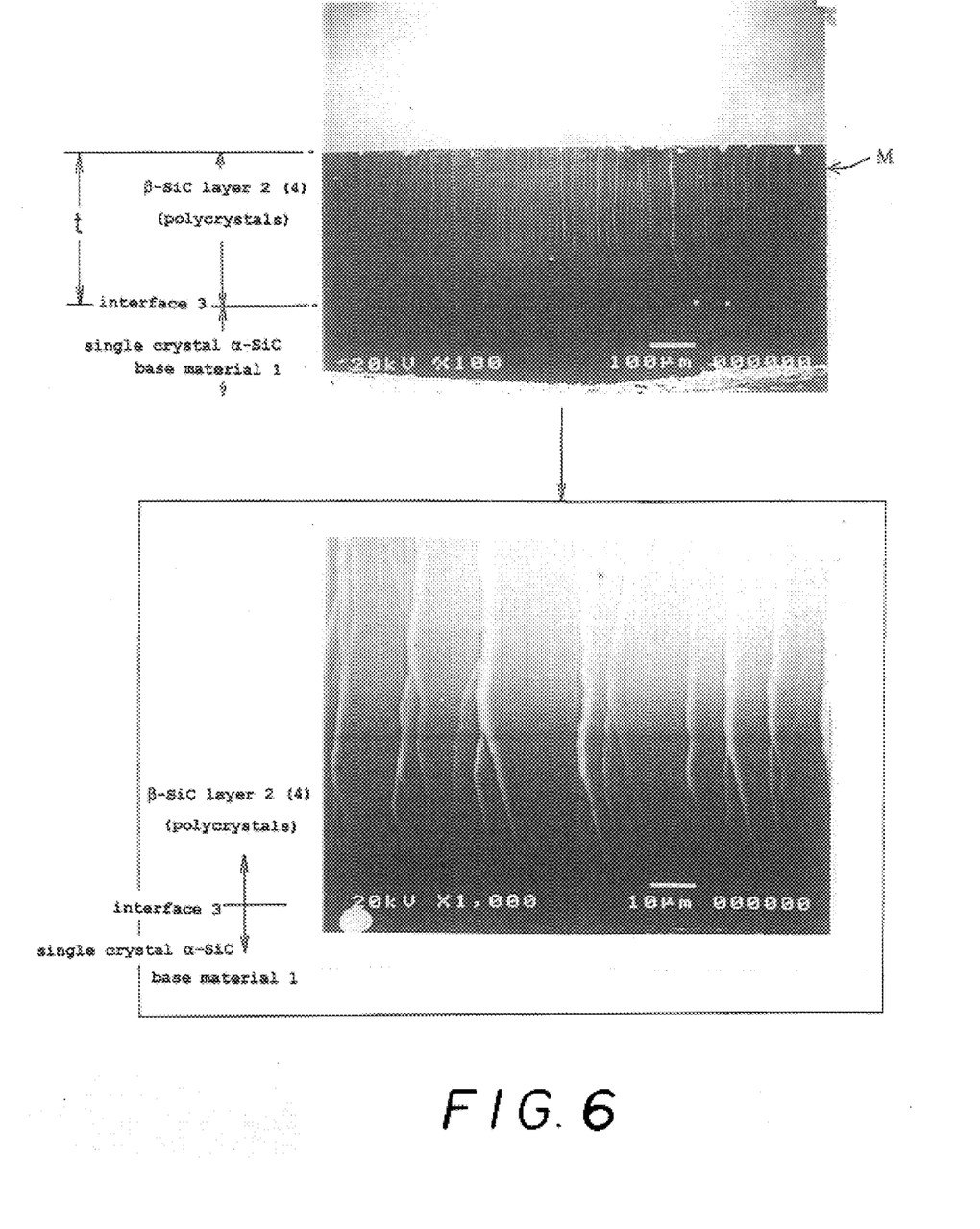
FIG. 6 is a microphotograph of an enlarged view of a main portion before the single crystal SiC of the third embodiment of the present invention is heat-treated.

Next, a third embodiment will be described. FIG. 4 is a diagram showing a state before single crystal SiC is heat-treated, and FIG. 5 is a schematic bottom view of the crystal. Plural single crystal hexagonal α-SiC base materials (6H type or 4H type) 1 . . . are regularly arranged so that the adjacent side faces 1*b*, 1*b* . . . closely contacted to each other. A polycrystalline cubic β-SiC plate 2 is grown in a layer-like manner on the surface of the whole of the plural single crystal α-SiC base materials 1 by the thermal CVD method in the range of 1,300 to 1,900° C. In the growing stage of the polycrystalline β-SiC plate 2, as clearly shown in a microphotograph of an etched section of FIG. 6, a polycrystal member 4 configured by plural single crystal columnar β-SiC which are closely regularly arranged is grown on the surface of the single crystal α-SiC base materials 1 . . . containing lattice defects, thereby forming a complex M in which the polycrystal member is contacts the single crystal α-SiC base materials 1 at crystal faces of different crystal forms, and which has an interface 3.

Thereafter, the whole of the complex M is subjected to a heat treatment in a temperature range of 1,900 to 2,400° C., preferably 2,000 to 2,200° C. and in a saturated SiC vapor pressure. As a result, adjacent ones of the plural single crystal α-SiC base materials 1 are fused and integrated at the closely contacted side faces 1*b*, 1*b*, and the polycrystal member 4 of the polycrystalline β-Sic plate 2 is transformed into single crystal α-SiC, so that a large single crystal 5 which is oriented in the same direction as the crystal axes of the single crystal α-SiC base materials 1 . . . and integrated with the single crystals of the base materials 1 is grown.

Figure 7:
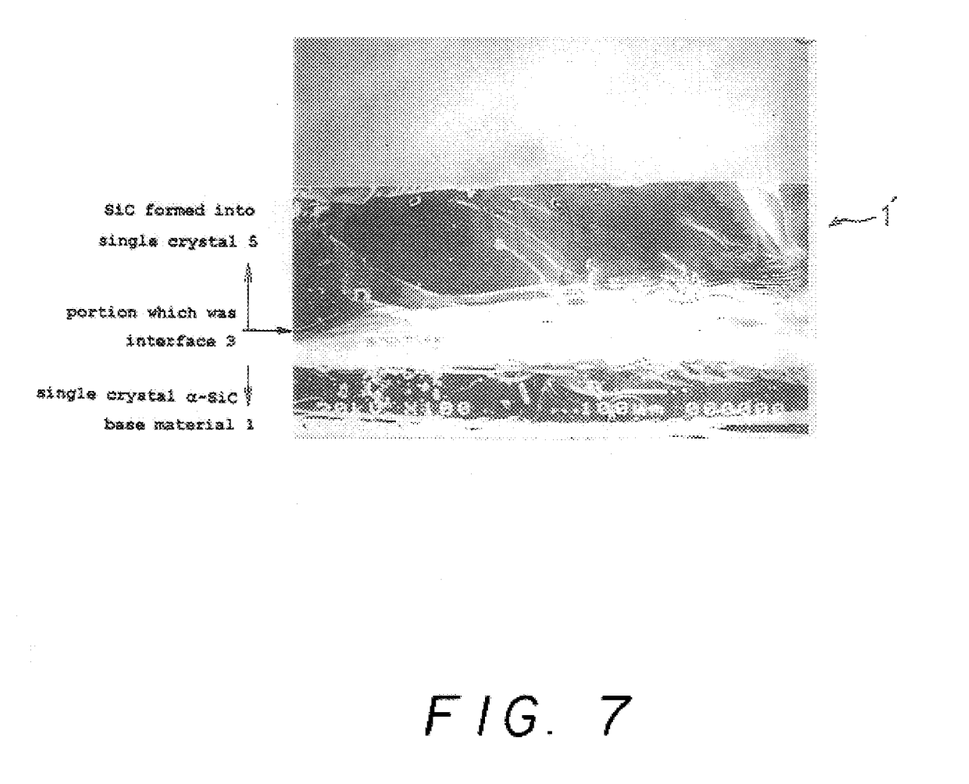
FIG. 7 is a microphotograph of an enlarged view of a main portion after the single crystal SiC of the third embodiment of the present invention is heat-treated.

As described above, the complex M in which the polycrystal member 4 of the polycrystalline β-SiC plate 2 is grown by the thermal CVD method on the surfaces of the plural single crystal α-SiC base materials 1 that are regularly arranged so that the adjacent side faces are closely contact each other is subjected to a heat treatment. Therefore, crystal growth which is very large in terms of area and which mainly consists of solid-phase growth, such as the lattice vibration which occurs in the interface 3 to change the atom arrangement is generated. As a result, as clearly shown in a microphotograph of an etched section of FIG. 7, single crystal SiC 1' of high quality which is substantially free from lattice defects and micropipe defects (10 or less per 1 cm$^2$) can be easily produced.

Figure 8:
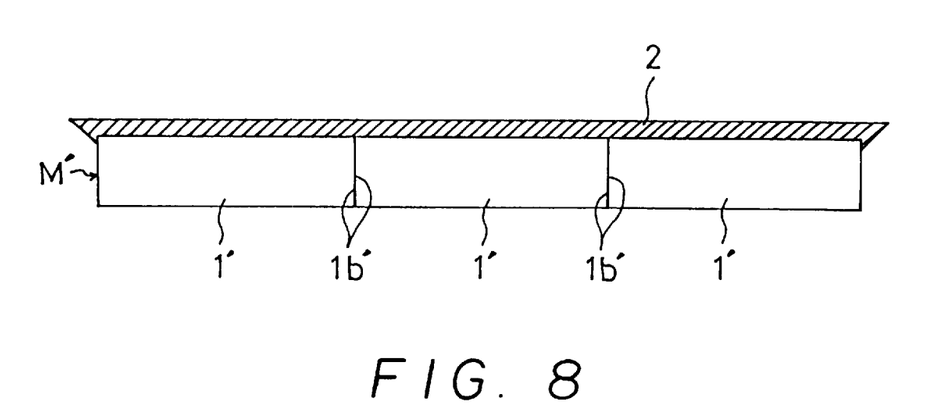
FIG. 8 is a diagram showing a state before single crystal SiC of a fourth embodiment of the present invention is heat-treated.

Next, a fourth embodiment will be described. In the fourth embodiment, plural high quality single crystal SiC 1' which are produced in the manner described in the third embodiment are reused as single crystal α-SiC base material. Specifically, as shown in FIG. 8, the plural high quality single crystal SiC 1' . . . are regularly arranged so that adjacent side faces 1'*b*, 1'*b* closely contact each other. The polycrystalline plate 2 having the orientation configured by plural single crystal cubic β-Sic which are closely arranged is grown by the thermal CVD method on the surface of the whole of the plural single crystal SiC 1' . . . , thereby forming a complex M'. Thereafter, the whole of the complex M' is subjected to a heat treatment in a temperature range of 1,900 to 2,400° C., preferably 2,000 to 2,200° C. and in a saturated SiC vapor pressure in the same manner as Embodiment 3 described above. As a result, a high quality single crystal SiC of a desired size can be easily produced as a final product.

In the embodiments, the single crystal α-SiC base material 1 is used as the single crystal SiC base material.

Alternatively, for example, an α-SiC sintered member or a single crystal β-SiC member may be used. In the embodiments, the polycrystalline β-SiC plate 2 is used as the polycrystalline plate consisting of Si and C atoms. Alternatively, for example, a polycrystalline α-SiC plate, an SiC sintered member of high purity, or an amorphous plate of high purity ($10^{14atm}$/cm$^3$) or less may be used, and it is possible to obtain single crystal SiC of high quality in the same manner as the embodiments.

As the single crystal α-SiC base material 1 in the embodiments, either of the 6H type or the 4H type may be used. When the 6H type is used, a single crystal which is converted from polycrystals of the polycrystalline β-SiC plate 2 into α-SiC as the progress of the heat treatment is easily grown in the same form as that of a single crystal of the 6H type. When the single crystal base material 1 of the 4H type is used, a single crystal in the same form as that of a single crystal of the 4H type is easily converted and grown as the progress of the heat treatment.

Preferably, the temperature conditions of the heat treatment of the complex M are set to be in the range of 1,850 to 2,400° C., preferably, 2,000 to 2,200° C. When the temperature of the heat treatment is lower than 1,850° C., the kinetic energy of atoms cannot be given to many SiC constituting the interface. When the temperature is higher than 2,400° C., thermal energy which is much higher than the decomposition energy of SiC is supplied and crystals of SiC themselves are decomposed.

As described above, the present invention discloses a technique that a complex in which a single crystal SiC base material and a polycrystalline plate are closely stacked together via a smooth polished face or a polycrystalline plate is grown by the thermal CVD method on the surfaces of plural single crystal SiC base materials that are regularly arranged with contacting side faces to one another is subjected to a heat treatment, so that polycrystals of the polycrystalline plate are transformed into a single crystal, and a single crystal oriented in the same direction as the crystal axis of the single crystal SiC base material is integrally grown to a large size, whereby a large single crystal of high quality which is superior in heat resistance and mechanical strength and which has a reduced number of micropipe defects and lattice defects can be produced easily and efficiently.

What is claimed is:

1. Single crystal SiC comprising: a single crystal SiC base material; and a complex in which said single crystal SiC base material and a polycrystalline plate consisting of Si and C atoms are stacked together via a smoothed face and subjected to a heat treatment, whereby polycrystals of said polycrystalline plate are transformed into a single crystal.

2. Single crystal SiC according to claim 1, wherein said single crystal SiC base material constituting said complex is single crystal α-SiC.

3. Single crystal SiC according to claim 1, wherein said polycrystalline plate constituting said complex is one of: an amorphous plate, and a polycrystalline β-SiC plate.

4. Single crystal SiC comprising: a plurality of single crystal SiC base materials; and a complex in which said plural single crystal SiC base materials are regularly arranged with adjacent side faces contacting one another, and a polycrystalline plate consisting of Si and C atoms are stacked together and subjected to a heat treatment, whereby polycrystals of said polycrystalline plate are transformed into a single crystal.

5. Single crystal SiC according to claim 4, wherein said plural single crystal SiC base materials constituting said complex, and said polycrystalline plate are stacked together via a smoothed face.

6. Single crystal SiC according to claim 4, wherein each of said plural single crystal SiC base materials constituting said complex is single crystal α-SiC.

7. Single crystal SiC according to claim 4, wherein said polycrystalline plate constituting said complex is one of an amorphous plate, and a polycrystalline β-SiC plate which is grown on surfaces of plural single crystal SiC base materials by a thermochemical vapor deposition method.

8. A method of producing single crystal SiC comprising the steps of: stacking a single crystal SiC base material and a polycrystalline plate consisting of Si and C atoms together to form a complex, the single crystal base material and the polycrystalline plate are smoothed in at least one face, and the single crystal SiC base material and the polycrystalline plate are stacked together via the smoothed face; and subjecting the complex to a heat treatment to transform polycrystals of the polycrystalline plate into a single crystal and grow the single crystal.

9. A method of producing single crystal SiC according to claim 8, wherein single crystal α-SiC is used as the single crystal SiC base material constituting the complex.

10. A method of producing single crystal SiC according to claim 8, wherein one of: an amorphous plate and a polycrystalline β-SiC plate is used as the polycrystalline plate constituting the complex.

11. A method of producing single crystal SiC according to claim 8, wherein the heat treatment is performed at a temperature of 1,850° C. or higher, and in one of: a saturated SiC vapor pressure and in an atmosphere in the vicinity thereof.

12. A method of producing single crystal SiC according to claim 8, wherein the heat treatment is performed in a temperature range of 2,200 to 2,400° C., and in one of: a saturated SiC vapor pressure and in an atmosphere in the vicinity thereof.

13. A method of producing single crystal SiC comprising the steps of: stacking plural single crystal SiC base materials that are regularly arranged with contacting adjacent side faces to one another, and a polycrystalline plate consisting of Si and C atoms together to form a complex; and subjecting the complex to a heat treatment to transform polycrystals of the polycrystalline plate into a single crystal and grow the single crystal.

14. A method of producing single crystal SiC according to claim 13, wherein the plural single crystal SiC base materials and the polycrystalline plate are smoothed in at least one face, and the single crystal SiC base materials and the polycrystalline plate are stacked together via the smoothed faces.

15. A method of producing single crystal SiC according to claim 13, wherein single crystal α-SiC is used as the plural single crystal SiC base materials.

16. A method of producing single crystal SiC according to claim 13, wherein single crystal SiC obtained by the heat-treatment of the complex is used as the plural single crystal SiC base materials which are regularly arranged with contacting adjacent side faces to one another.

17. A method of producing single crystal SiC according to claim 13, wherein one of: an amorphous plate and a polycrystalline β-SiC plate grown on surfaces of plural single crystal SiC base materials by a thermochemical vapor deposition method is used as the polycrystalline plate.

18. A method of producing single crystal SiC according to claim 17, wherein one of: the amorphous plate and the polycrystalline β-SiC plate is grown on surfaces of plural single crystal SiC base materials by a thermochemical vapor deposition method in a range of 1,300 to 1,900° C.

19. A method of producing single crystal SiC according to claim 17, wherein the temperature of the heat-treatment of the complex is higher than the temperature of the thermochemical vapor deposition method in the growth of the amorphous plate and polycrystalline β-SiC plate, and in a saturated SiC vapor pressure.

20. A method of producing single crystal SiC according to claim 13, wherein the heat treatment of the complex is performed at a temperature of 1,850° C. or higher, and in one of: a saturated SiC vapor pressure and in an atmosphere in the vicinity thereof.

21. A method of producing single crystal SiC according to claim 13, wherein the heat treatment of the complex is performed in a temperature range of 2,200 to 2,400° C., and in one of a saturated SiC vapor pressure and in an atmosphere in the vicinity thereof.

* * * * *